(12) United States Patent
Kim et al.

(10) Patent No.: US 11,067,887 B2
(45) Date of Patent: Jul. 20, 2021

(54) APPARATUS FOR MANUFACTURING PELLICLE

(71) Applicant: SAMSUNG ELECTRONICS CO., LTD., Suwon-si (KR)

(72) Inventors: Mun-Ja Kim, Suwon-si (KR); Ji-Beom Yoo, Seoul (KR); Soo-Young Kim, Suwon-si (KR); Hee-Bom Kim, Hwaseong-si (KR); Hwan-Chul Jeon, Seoul (KR); Seul-Gi Kim, Suwon-si (KR); Tae-Sung Kim, Suwon-si (KR); Dong-Wook Shin, Changwon-si (KR)

(73) Assignees: SAMSUNG ELECTRONICS CO., LTD., Suwon-si (KR); Research & Business Foundation SUNGKYUNKWAN UNIVERSITY, Suwon (KR)

( * ) Notice: Subject to any disclaimer, the term of this patent is extended or adjusted under 35 U.S.C. 154(b) by 0 days.

(21) Appl. No.: 16/918,106

(22) Filed: Jul. 1, 2020

(65) Prior Publication Data
US 2020/0333701 A1    Oct. 22, 2020

Related U.S. Application Data

(62) Division of application No. 15/690,879, filed on Aug. 30, 2017, now Pat. No. 10,747,104.

(30) Foreign Application Priority Data

Mar. 27, 2017    (KR) .................. 10-2017-0038366

(51) Int. Cl.
*G03F 1/64*    (2012.01)

(52) U.S. Cl.
CPC ...................... *G03F 1/64* (2013.01)

(58) Field of Classification Search
CPC ...................... G03F 1/66; G03F 1/64
See application file for complete search history.

(56) References Cited

U.S. PATENT DOCUMENTS

| 5,368,675 | A | 11/1994 | Hamada et al. |
| 5,693,382 | A | 12/1997 | Hamada et al. |
| 5,772,842 | A * | 6/1998 | Tanaka ............... B29C 63/0013 156/718 |
| 7,572,490 | B2 | 8/2009 | Park et al. |
| 8,133,640 | B2 | 3/2012 | Lee et al. |
| 8,518,189 | B2 * | 8/2013 | Hotzel ...................... G03F 1/82 134/31 |
| 2007/0128552 | A1 * | 6/2007 | Sawada .................... G03F 1/84 430/311 |

(Continued)

FOREIGN PATENT DOCUMENTS

| JP | 1994-175358 A | 6/1994 |
| JP | 1995-168345 A | 7/1995 |
| JP | 1998-339944 A | 12/1998 |

(Continued)

*Primary Examiner* — Philip C Tucker
*Assistant Examiner* — John Blades
(74) *Attorney, Agent, or Firm* — Lee IP Law, P.C.

(57) ABSTRACT

A method of manufacturing a pellicle includes preparing a pellicle frame having an adhesive layer coated thereon, treating a pellicle membrane with vapor under vapor atmosphere, attaching the pellicle membrane onto the pellicle frame, and drying the pellicle membrane.

14 Claims, 12 Drawing Sheets

(56) References Cited

U.S. PATENT DOCUMENTS

2011/0189594 A1    8/2011    Sekihara

FOREIGN PATENT DOCUMENTS

| | | |
|---|---|---|
| JP | 2001-109131 A | 4/2001 |
| JP | 2005-316485 A | 11/2005 |
| JP | 2006-310047 A | 11/2006 |
| JP | 2009-157057 A | 7/2009 |
| JP | 2013-183112 A | 9/2013 |
| JP | 2016-168589 A | 9/2016 |
| KR | 10-1624078 B1 | 5/2016 |
| WO | WO 2015-182483 A1 | 12/2015 |

* cited by examiner

APPARATUS FOR MANUFACTURING PELLICLE

CROSS-REFERENCE TO RELATED APPLICATION

This is a division of U.S. patent application Ser. No. 15/690,879 filed Aug. 30, 2017, the entire contents of which is hereby incorporated by reference.

This application claims priority under 35 U.S.C. § 119 to Korean Patent Application No. 10-2017-0038366, filed on Mar. 27, 2017 in the Korean Intellectual Property Office (KIPO), the contents of which are herein incorporated by reference in their entirety.

BACKGROUND

1. Field

Example embodiments relate to a method of manufacturing a pellicle and an apparatus for assembling the pellicle. More particularly, example embodiments relate to a method of manufacturing a pellicle for a photomask and an apparatus for assembling the pellicle.

2. Description of the Related Art

While performing a photo-exposure process during fabricating a semiconductor device, a pellicle including a transparent pellicle membrane may be disposed on a surface of a photomask to protect the photomask from contaminants. A pellicle membrane used in an extreme ultra violet (EUV) photolithography process may have a relatively thin thickness (e.g., about 100 nm or less).

SUMMARY

According to example embodiments, a method of manufacturing a pellicle may include preparing a pellicle frame having an adhesive layer coated thereon. A pellicle membrane is treated with vapor under vapor atmosphere. After the vapor treatment, the pellicle membrane is attached on the pellicle frame and then is dried.

According to example embodiments, a method of manufacturing a pellicle may include preparing a pellicle frame having an adhesive layer coated thereon. The pellicle frame is loaded onto a pellicle support within a chamber and then, a pellicle membrane is loaded into a space over the pellicle support. A liquid may be received into a bath which is under the pellicle support, and is vaporized to maintain the chamber in vapor atmosphere. The pellicle membrane is attached on the pellicle frame. The pellicle membrane is dried.

According to example embodiments, a pellicle assembling apparatus may include a chamber providing a space in which a pellicle membrane is assembled, a pellicle support within the chamber configured to support a pellicle frame for attaching the pellicle membrane thereon and including a support plate having a cavity to allow vapor to flow through the cavity, and a vapor generator configured to maintain the chamber in vapor atmosphere.

BRIEF DESCRIPTION OF THE DRAWINGS

Example embodiments will be more clearly understood from the following detailed description taken in conjunction with the accompanying drawings.

FIG. 1 is a schematic cross-sectional view illustrating a pellicle assembling apparatus in accordance with example embodiments.

FIG. 2 is a perspective view illustrating the pellicle assembling apparatus in FIG. 1.

FIG. 3 is a plan view illustrating a pellicle support of the pellicle assembling apparatus in FIG. 1.

FIG. 4 is a perspective view illustrating a pellicle frame supported on the pellicle support in FIG. 1.

FIG. 5 is a cross-sectional view illustrating the pellicle frame supported on the pellicle support in FIG. 1.

FIG. 6 is a cross-sectional view illustrating a handling frame transferring a pellicle membrane to the pellicle support in FIG. 1.

FIG. 7 is a cross-sectional view illustrating the pellicle membrane loaded into a chamber and treated with steam in the pellicle assembling apparatus in FIG. 1.

FIG. 8 is a cross-sectional view illustrating the pellicle membrane stamped on the pellicle frame in FIG. 5.

FIG. 9 is a cross-sectional view illustrating a pellicle manufactured by stamping the pellicle membrane on the pellicle frame in FIG. 8.

FIG. 10 is a flowchart illustrating a method of manufacturing a pellicle in accordance with example embodiments.

FIGS. 11 to 16 are views illustrating a method of manufacturing a pellicle in accordance with some example embodiments.

FIGS. 17 to 20 are views illustrating a method of manufacturing a pellicle in accordance with some example embodiments.

FIG. 21 is a cross-sectional view illustrating a photomask assembly in accordance with example embodiments.

FIG. 22 is a cross-sectional view illustrating a photo-exposure apparatus in accordance with example embodiments.

DETAILED DESCRIPTION OF EXAMPLE EMBODIMENTS

Hereinafter, example embodiments will be explained in detail with reference to the accompanying drawings.

Figure 1:
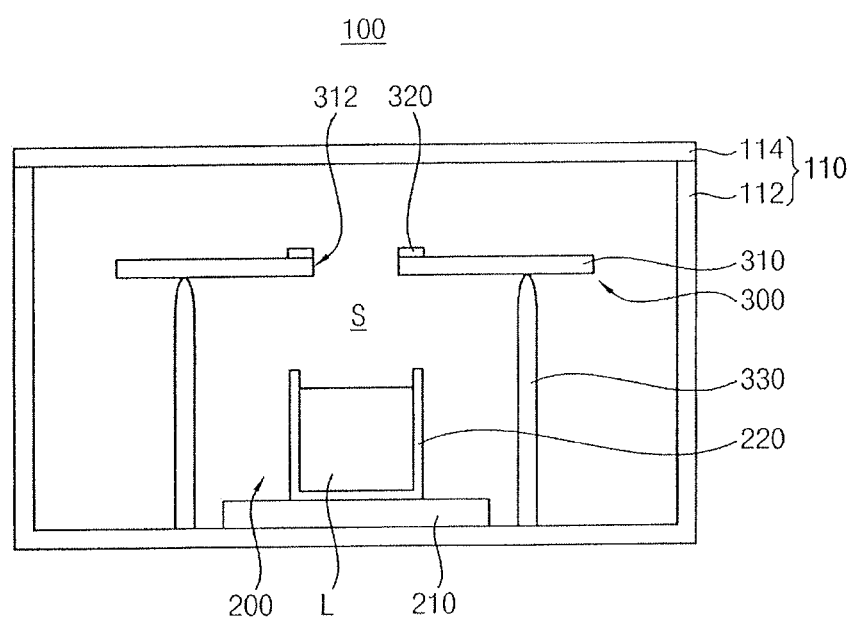
FIGS. 1 to 22 represent non-limiting example embodiments as described hereafter.
Figure 2:
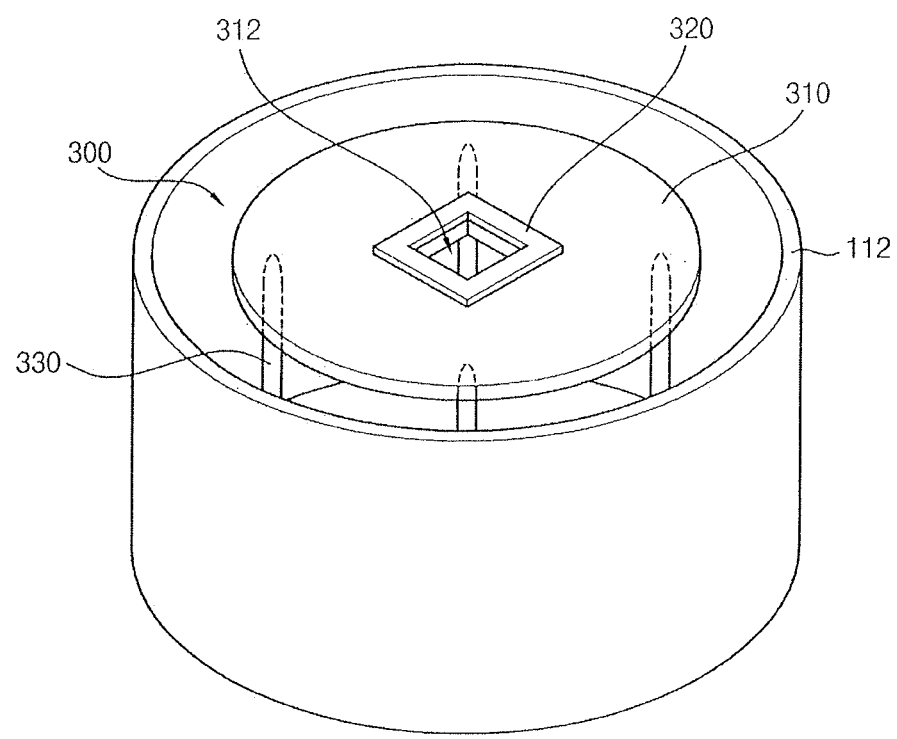
Figure 3:
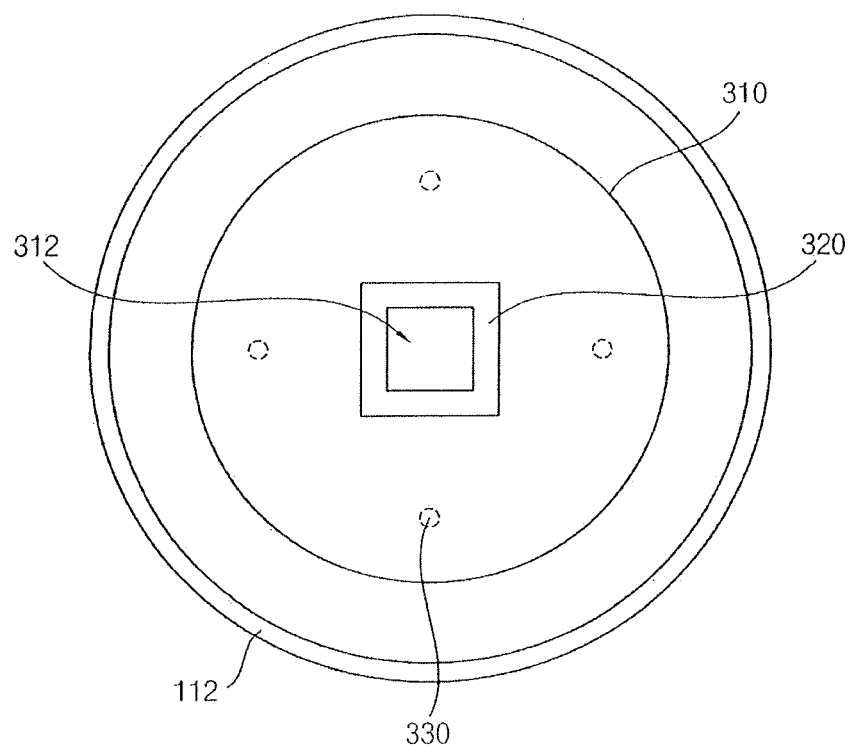
Figure 4:
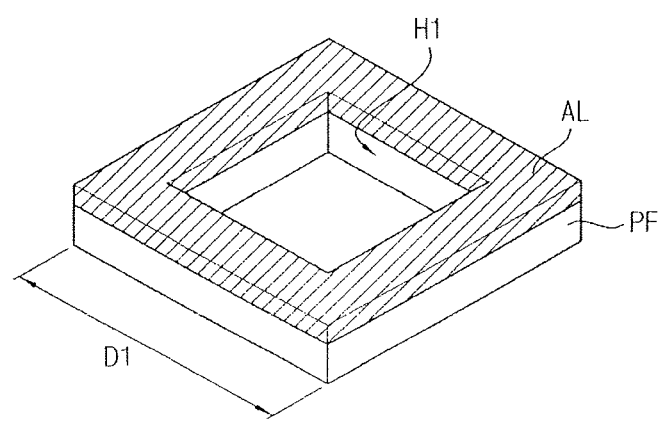
Figure 5:
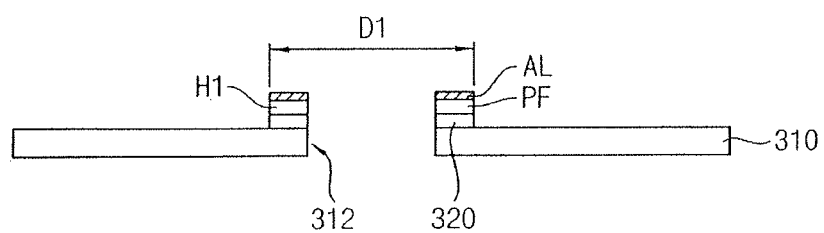
Figure 6:
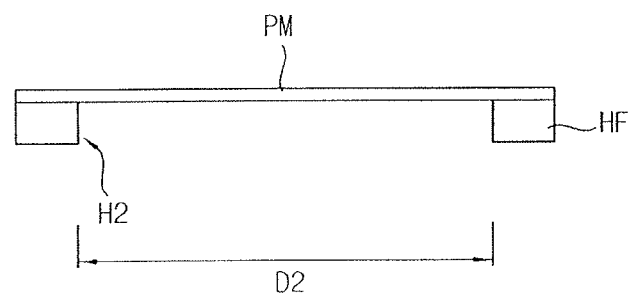
Figure 7:
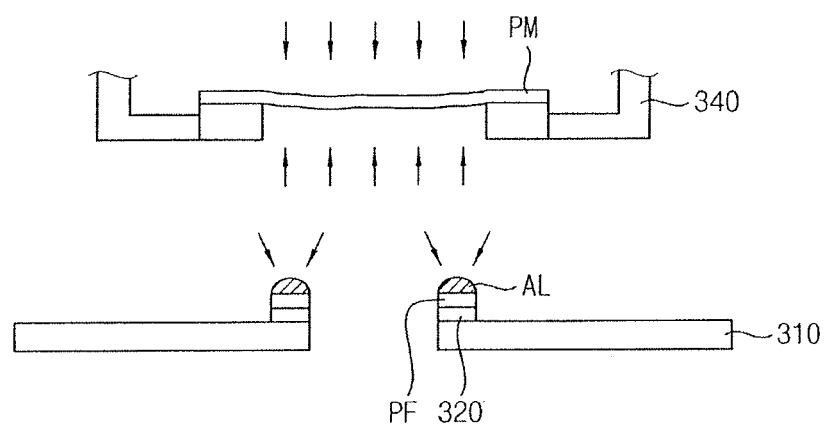
Figure 8:
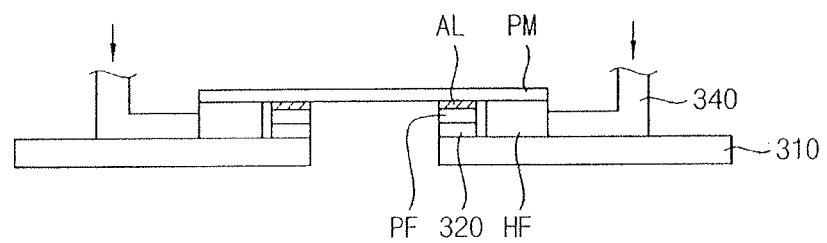
Figure 9:
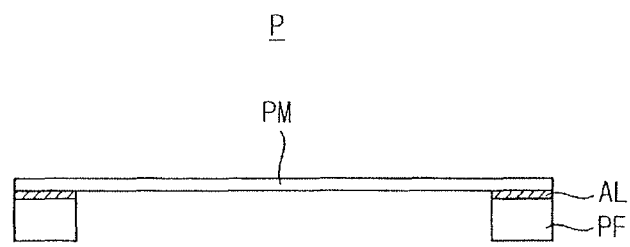

FIG. 1 is a cross-sectional view illustrating a pellicle assembling apparatus in accordance with example embodiments. FIG. 2 is a perspective view illustrating the pellicle assembling apparatus in FIG. 1. FIG. 3 is a plan view illustrating a pellicle support of the pellicle assembling apparatus in FIG. 1. FIG. 4 is a perspective view illustrating a pellicle frame supported on the pellicle support in FIG. 1. FIG. 5 is a cross-sectional view illustrating the pellicle frame supported on the pellicle support in FIG. 1. FIG. 6 is a cross-sectional view illustrating a handling frame transferring a pellicle membrane to the pellicle support in FIG. 1. FIG. 7 is a cross-sectional view illustrating the pellicle membrane loaded into a chamber and treated with steam, e.g., vapor, in the pellicle assembling apparatus in FIG. 1. FIG. 8 is a cross-sectional view illustrating the pellicle membrane stamped on the pellicle frame in FIG. 5. FIG. 9 is a cross-sectional view illustrating a pellicle manufactured by stamping the pellicle membrane on the pellicle frame in FIG. 8.

Referring to FIGS. 1 to 9, a pellicle assembling apparatus 100 may include a chamber 110 configured to provide a space S for assembling a pellicle P which covers a photomask, a vapor generator 200 configured to generate a vapor atmosphere in the chamber 110, and a pellicle support 300 configured to support the pellicle P which is assembled in the chamber 110.

In example embodiments, the pellicle assembling apparatus 100 may attach a pellicle membrane PM onto a pellicle frame PF and remove wrinkles in the pellicle membrane PM to manufacture a pellicle assembly P. For example, the pellicle assembly P may be installed on a photomask for use in a photo-exposure device which uses EUV light or an electron beam as light sources. The light sources may have a wavelength of a soft X-ray region from about 6.75 nm to about 13.5 nm. The EUV pellicle may have a relatively thin thickness (e.g., about 0.1 nm to about 100 nm), and the pellicle assembling apparatus 100 may remove or reduce wrinkles generated in the pellicle member PM during assembling the pellicle.

As illustrated in FIG. 1, the chamber 110 may include a lower chamber 112 and an upper cover 114. The chamber 110 may have a generally cylindrical shape. Alternatively, the chamber 110 may have a polyprism shape. The lower chamber 112 may have a bottom wall and a sidewall defining the space S. The upper cover 114 may cover the lower chamber 112 to form an airtight space S. The upper cover 114 may be moved manually or automatically by a driving mechanism to open and close the chamber.

The vapor generator 200 may be disposed in a lower portion of the chamber to maintain the chamber in vapor atmosphere. The vapor generator 200 may include a heater 210 disposed on a bottom wall of the lower chamber 112 and a vaporizing portion 220 disposed on the heater 210 and receiving a liquid L which is vaporized by heater 210.

For example, the heater 210 may include a hot plate. The vaporizing portion 220 may include a bath for receiving the liquid L. The liquid L may include water or organic solvents. Examples of the organic solvents may be alcohol such as isopropyl alcohol, ethanol, etc.

The heater 210 may heat the liquid L within the bath of the vaporizing portion 220 to generate vapor. The vapor may be circulated by natural convection within the chamber 110 to maintain the chamber 110 in vapor atmosphere. When the liquid L includes water, a drop size, e.g., diameter, of the water vapor may range from about 1 nm to about 10 μm. A heating temperature of the heater 210 may be controlled depending on a temperature of the chamber 110, the liquid, an amount of the vapor, etc.

Alternatively, the vapor generator may include a vaporizing portion disposed outside the chamber 110 and a supply line introducing vapor generated by the vaporizing portion into the chamber 110. In this case, the vapor generator may supply the vapor through the supply line which is installed on the bottom wall.

The pellicle support 300 may support the pellicle P which is assembled over the vapor generator 200 in the chamber 110. The pellicle support 300 may include a support plate 310 which is positioned at a predetermined height on vertical extensions 330 extending upwardly from the bottom wall of the chamber 110.

The support plate 310 may have a cavity 312 for allow the vapor to pass therethrough and at least one protruding support 320 around the cavity 312. The protruding support 320 may protrude from the support plate 310 by a predetermined height and contact and support the pellicle frame PF. The protruding support 320 may have a size and a shape corresponding to the pellicle frame PF. When the pellicle frame PF has a rectangular frame shape, the protruding support 320 may have a rectangular frame shape corresponding to the pellicle frame PF. Alternatively, a plurality of the protruding supports may be formed to be spaced apart from each other along a circumference of the cavity 312 to support the pellicle frame PF.

Although it is not illustrated in the figures, the pellicle assembling apparatus 100 may further include an exhaust port for discharging the vapor within the chamber 110 to the outside. Further, the pellicle assembling apparatus 100 may further include a temperature sensor for detecting a temperature of the chamber or the pellicle frame.

As illustrated in FIGS. 4 and 5, the pellicle frame PF may be loaded onto the pellicle support 300 within the chamber 110. The pellicle frame PF may be used to support fixedly the pellicle membrane PM. For example, the pellicle frame PF may include aluminum, titanium, stainless steel, carbon, diamond like carbon (DLC), silver, iron, nickel, cobalt, copper, silicon, or a combination thereof, and have an excellent mechanical strength.

The pellicle frame PF may have a first opening H1 in a middle region. For example, the first opening H1 may have a rectangular shape. The pellicle frame PF may have an outer diameter of a first size D1. The first size D1 may range from about 40 mm to about 150 mm.

An adhesive layer AL may be coated on an upper surface of the pellicle frame PF. For example, the pellicle frame PF having the adhesive layer AL coated thereon may be supported on the protruding support 320 of the pellicle support 300. For example, the adhesive layer AL may include polyvinyl alcohol, polyvinyl acetate, etc.

As illustrated in FIGS. 6 to 8, the pellicle membrane PM may be treated with the vapor over the support plate 310 within the chamber 110, and then, may be attached onto the pellicle frame PF.

In example embodiments, the pellicle support 300 may further include a frame holder 340 for holding and load/unload a handling frame HF into/from the chamber 110. The frame holder 340 may hold the handling frame HF which supports the pellicle membrane PM and load the handling frame HF into a space over the support plate 310 within the chamber 110, may maintain the handling frame HF at a predetermined height from an upper surface of the support plate 310, and move downward and pressurize the handling frame HF against the upper surface of the support plate 310 to stamp the pellicle membrane PM disposed on the handling frame HF onto the pellicle frame PF. This stamping, e.g., striking with force, may attach the pellicle membrane PM onto the pellicle frame PF. After the stamping, the pellicle membrane PM may be separated from the handling frame HF.

The pellicle membrane PM may include carbon allotrope, e.g., carbon nano tube CNT or graphene. For example, the pellicle membrane PM may include graphene, graphite, single-layered graphene, graphene oxide, graphite oxide, graphite hydrate, etc.

The handling frame HF may have a shape corresponding to the pellicle frame PF. When the pellicle frame PF has a rectangular frame shape, the handling frame HF may have a rectangular frame shape corresponding to the pellicle frame PF.

The handling frame HF may have a second opening H2 in a middle region. For example, the second opening H2 may have a rectangular shape. The handling frame HF may have an inner diameter of a second size D2 greater than the first size D1. Accordingly, when the pellicle membrane PM is stamped on the pellicle frame PF, the pellicle frame PF may be positioned within the second opening H2 of the handling frame HF. If it is satisfied that the pellicle frame PF is positioned within the second opening H2 of the handling frame HF, the shape, the size, the thickness, etc. of the handling frame HF may not be limited thereto.

As illustrated in FIG. 7, after the pellicle membrane PM is held and loaded over the support plate 310 within the chamber 110 by the frame holder 340, the vapor generator 200 may heat the liquid L in the vaporizing portion 220 to generate vapor and may treat the pellicle membrane PM with the vapor, thereby removing or reducing wrinkles in the pellicle member PM.

Additionally, the gel-phase adhesive layer AL coated on the pellicle frame PF may be changed into a liquid phase above the glass transition temperature Tg. Accordingly, even when the adhesive layer is coated unevenly, the adhesive layer may be leveled under water vapor atmosphere. The adhesive layer AL may be treated with the vapor to be swollen, and then, may shrink again when drying to stretch the pellicle membrane PM more tight.

When the pellicle membrane is supported in a predetermined height over the pellicle frame PF having the gel-phase adhesive layer coated thereon within the chamber 110, before the adhesive layer AL is hardened, the chamber may be maintained under the water vapor atmosphere. Temperature of the water vapor atmosphere may be from about 100° C. to about 130° C.

Thus, the water vapor may make contact with a surface of the pellicle membrane PM, and condense on the surface of the pellicle membrane PM to form a thin water film of about 100 nm or less. The water film having a surface tension less than a surface tension of water may remove or reduce wrinkles in the pellicle membrane PM. When the water vapor has a diameter of about 1 μm, the water vapor may exert a tension of several to tens of mN on the surface of the pellicle membrane PM, thereby removing or reducing wrinkles in the pellicle membrane PM.

Because the pellicle membrane PM is a hydrophobic material vapor, the pellicle membrane PM may not expand hardly under water vapor atmosphere, while the adhesive layer AL may react with the water vapor under the water vapor atmosphere to swell and level, and then, may shrink again when dried to stretch the pellicle membrane PM more tight.

As illustrated in FIG. 9, after the pellicle membrane PM is treated with the vapor to remove wrinkles, the pellicle membrane PM may be dried, and then, a pellicle assembly P having the pellicle membrane PM attached on the pellicle frame PF may be formed.

Hereinafter, a method of manufacturing a pellicle using the pellicle assembling apparatus 100 in FIG. 1 will be explained.

Figure 10:
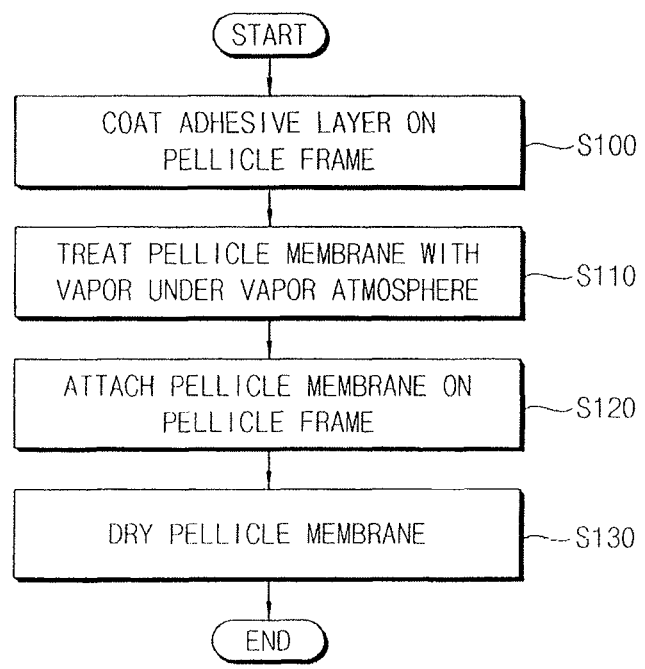

FIG. 10 is a flowchart illustrating a method of manufacturing a pellicle in accordance with example embodiments. FIGS. 11 to 16 are views illustrating a method of manufacturing a pellicle in accordance with example embodiments. FIG. 13 is a plan view of FIG. 12.

Referring to FIG. 1 and FIGS. 10 to 16, a pellicle membrane PM formed on a handling frame HF may be prepared.

Figure 11:
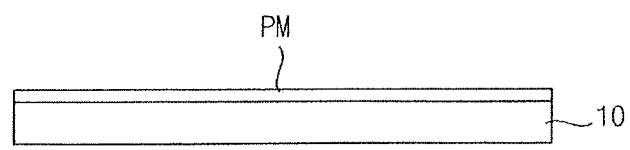

Referring to FIG. 11, in some example embodiments, a pellicle membrane PM may be formed on a first surface of a substrate 10.

The substrate 10 may include, e.g., silver, iron, nickel, cobalt, copper, silicon or a combination thereof. The substrate 10 may have a single-layered structure or a multi-layered structure. The pellicle membrane PM may include carbon allotrope, e.g., carbon nano tube (CNT) or graphene.

For example, the pellicle membrane PM may include graphene, graphite, single-layered graphene, graphene oxide, graphite oxide, graphite hydrate, etc. The pellicle membrane PM may have a thickness ranging from about 0.1 nm to about 100 nm.

When the pellicle membrane PM includes graphene, the pellicle membrane PM may be formed by, e.g., an exfoliation method, a sublimation method (e.g., a method of forming graphene on a SiC substrate), a chemical vapor deposition (CVD) process or a spin coating process. The CVD process may include, e.g., a rapid thermal CVD (RTCVD) process, an inductively coupled plasma CVD (ICP-CVD) process, a low pressure CVD (LPCVD) process, an atmospheric pressure CVD (APCVD) process, a metal organic CVD (MOCVD) process, a plasma enhanced CVD (PECVD) process, etc.

Figure 12:
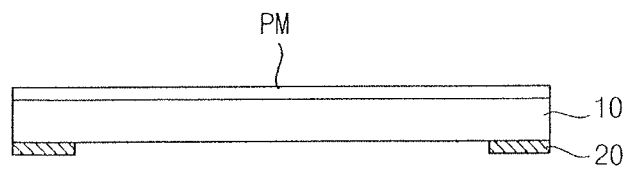
Figure 13:
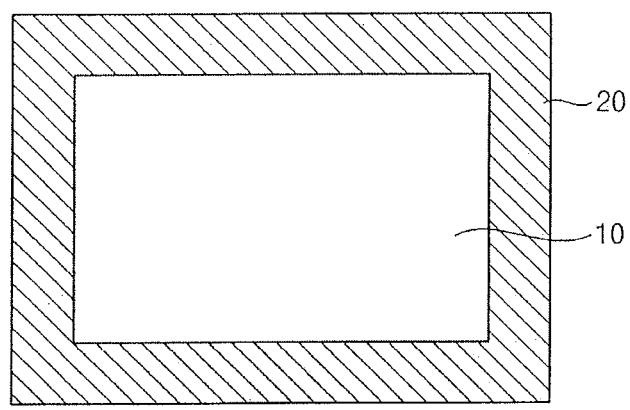

Referring to FIGS. 12 and 13, in some example embodiments, a protective layer pattern 20 may be formed on a second surface of the substrate 10 opposite to the first surface of the substrate 10.

The protective layer pattern 20 may be formed to partially cover the second surface of the substrate 10. The protective layer pattern 20 may include, e.g., a photoresist material, a polymer material, or an adhesive material.

The protective layer pattern 20 may be formed on a peripheral region of the substrate 10. Thus, the protective layer pattern 20 may expose a middle region of the substrate 10.

Figure 14:
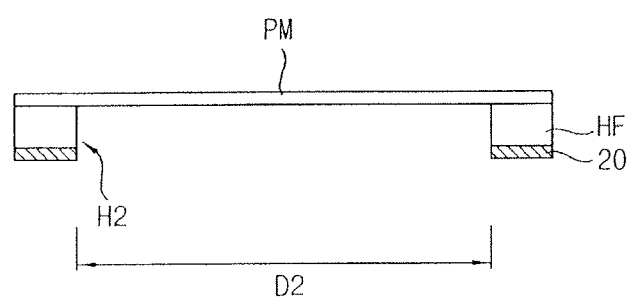

Referring to FIG. 14, a portion of the substrate 10 may be removed using the protective layer pattern 20 to form a handling frame HF.

For example, the substrate 10 may be immersed in an etchant solution so that the substrate 10 may be partially removed. The etchant solution may have a relatively high etching rate for the substrate 10, and may have a relatively low etching rate for the protective layer pattern 20 and the pellicle layer PM.

Thus, a portion of the substrate 10 exposed by the protective layer pattern 20 may be removed, and a portion of the substrate 10 covered by the protective layer pattern 20 may remained to form the handling frame HF. For example, the handing frame HF may be formed along a peripheral region of the pellicle membrane PM. The handling frame HF may have a second opening H2 in a middle region. For example, the second opening H2 may have a rectangular shape. The handling frame HF may have an inner diameter D2. The inner diameter D2 may range from about 45 mm to about 160 mm.

Figure 15:
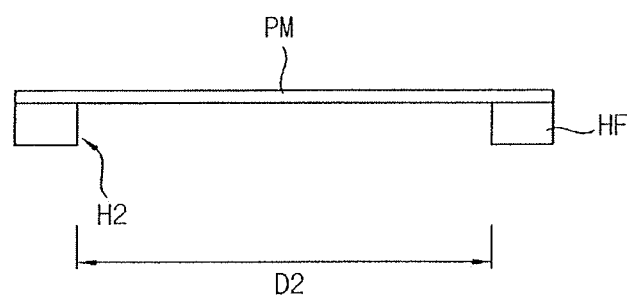

Referring to FIG. 15, the protective layer pattern 20 may be removed to obtain the pellicle membrane PM on the handling frame HF.

For example, the handling frame HF may be immersed in a second etchant solution so that the protective layer pattern 20 may be removed from the handling frame HF. The second etchant solution may have a relatively low etching rate with respect to the handling frame HF, and may have a relatively high etching rate with respect to the protective layer pattern 20. Accordingly, only the protective layer pattern 20 may be removed by the second etchant solution.

Figure 16:
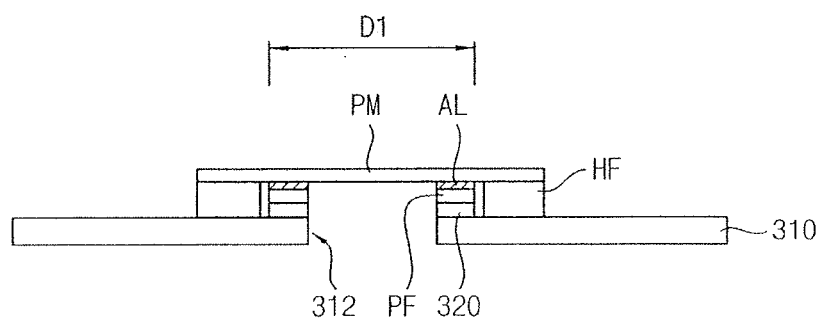

Referring to FIG. 16, the pellicle frame PF having an adhesive layer AL coated thereon may be loaded onto the pellicle support 300 (S100), and then, the handling frame HF having the pellicle membrane PM disposed thereon may be loaded over the pellicle support 300, and then the pellicle membrane PM may be treated with vapor under vapor atmosphere (S110). Then, the pellicle membrane PM may be attached onto the pellicle frame PF (S120), and then, the pellicle membrane PM may be dried (S130).

The pellicle frame PF may be loaded onto the pellicle support 300 within the chamber 110 in FIG. 1. The pellicle frame PF may be used for fixing and supporting the pellicle membrane PM. For example, the pellicle frame PF may include silver, iron, nickel, cobalt, copper, silicon, or a combination thereof, and thus, have an excellent mechanical strength.

The pellicle frame PF may have a first opening H1 in a middle region. For example, the first opening H1 may have a rectangular shape. The pellicle frame PF may have an outer diameter of a first size D1. The pellicle frame PF may have the outer diameter of the first size D1 smaller than the second size D2.

The adhesive layer AL may be coated on an upper surface of the pellicle frame PF. For example, the pellicle frame PF having the adhesive layer AL coated thereon may be supported on the protruding support 320 of the pellicle support 300. For example, the adhesive layer AL may include polyvinyl alcohol, polyvinyl acetate, etc.

The handling frame HF having the pellicle membrane PM disposed thereon may be loaded into a space over the pellicle support 300 within the chamber 110 in FIG. 1. Then, the vapor generator 200 in FIG. 1 may heat the liquid L in the vaporizing portion 220 to generate vapor and may treat the pellicle membrane PM with the vapor, thereby removing or reducing wrinkles in the pellicle member PM. Additionally, the gel-phase adhesive layer AL coated on the pellicle frame PF may be treated with the vapor to be swollen, and then, may shrink again when drying to stretch the pellicle membrane PM more tight.

Then, the pellicle membrane PM may be attached onto the pellicle frame PF. The pellicle membrane PM may be stamped on the pellicle frame PF by the handling frame HF. The pellicle membrane PM may be attached onto the pellicle frame PF by the adhesive layer AL.

Then, the pellicle member PM may be dried and the handling frame HF may be removed to manufacture the pellicle having the pellicle membrane PM and the pellicle frame PF.

FIGS. 17 to 20 are views illustrating a method of manufacturing a pellicle in accordance with some example embodiments. The method of manufacturing the pellicle may be substantially the same as or similar to the method of manufacturing the pellicle as described with reference to FIGS. 10 to 16, except for a step of attaching a pellicle membrane onto a pellicle frame though a handling frame. Thus, same reference numerals will be used to refer to the same or like elements and any further repetitive explanation concerning the above elements will be omitted.

Figure 17:
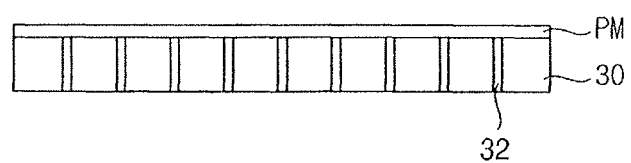

Referring to FIG. 17, a pellicle membrane PM may be formed on a transfer membrane 30, e.g., a porous transfer membrane 30.

In some example embodiments, the pellicle membrane PM may be formed on a substrate, the substrate may be removed using an etchant solution, and then, the pellicle membrane PM may be attached onto the transfer membrane 30.

For example, the substrate may include a metal foil having nickel (Ni), copper (Cu), etc. The substrate may be removed from the pellicle membrane PM using the etchant solution. The etchant solution may include, for example, a hydrochloric acid, a nitric acid, a sulfuric acid, an acetic acid, a hydrofluoric acid, aqua regia (e.g., a mixture of nitric acid and hydrochloric acid) or a combination thereof, however, it may not be limited thereto.

The pellicle membrane PM may be attached onto the transfer membrane 30 in a liquid contained in a bath. The liquid may include deionized water (DIW), an organic solvent, or a combination thereof. In a state in which the pellicle membrane PM is dipped in the liquid in the bath, the porous transfer membrane 30 may be dipped in the liquid to attach the pellicle membrane PM thereon.

The porous transfer membrane 30 may have a plurality of pores penetrating the porous transfer membrane 30. Each pore in the porous transfer membrane 30 may have a size of from about 10 nm to about 3 μm.

Figure 18:
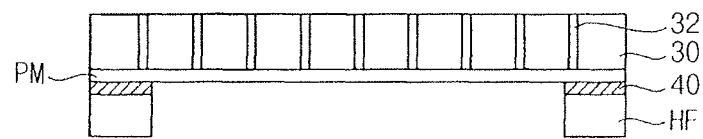

Referring to FIG. 18, in a state in which the pellicle membrane PM is attached on the porous transfer membrane 30, the pellicle membrane PM may be formed on a handling frame HF.

The pellicle membrane PM may be attached onto the handling frame HF using the porous transfer membrane 30 in a dry atmosphere. The porous transfer membrane 30 may be used for transferring the pellicle membrane PM onto the handling frame HF. In this case, the pellicle membrane PM may be attached onto the handling frame HF by an adhesive layer 40.

The handling frame HF may have a second opening H2 in a middle region. For example, the second opening H2 may have a rectangular shape. The handling frame HF may have an inner diameter D2. The inner diameter D2 may range from about 45 mm to about 160 mm. The handling frame HF may include a metal or a polymer. For example, the handling frame HF may include carbon, diamond like carbon (DLC), aluminum, stainless steel, or polyethylene, however, it may not be limited thereto. The adhesive layer 40 may include, for example, an acrylic resin, an epoxy resin, a fluoric resin, etc., however, it may not be limited thereto.

Figure 19:
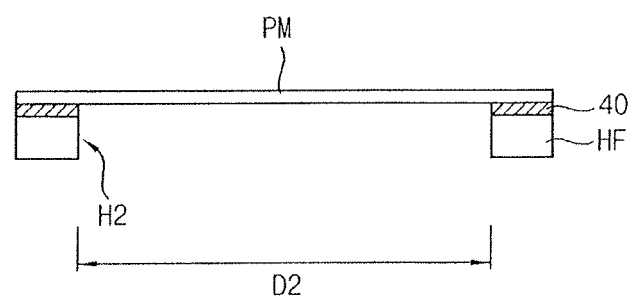

Referring to FIG. 19, the porous transfer membrane 30 may be removed to obtain the pellicle membrane PM disposed on the handling frame HF.

For example, the porous transfer membrane 30 may be separated from the pellicle membrane PM in a state in which a portion of the liquid remains in inner spaces of the plurality of pores 32 in the porous transfer membrane 30. Because the pellicle membrane PM is attached onto the porous transfer membrane 30 by a surface tension and capillary phenomenon of the liquid having a relatively weak adhesive force, after the porous transfer membrane 30 is completely separated from the pellicle membrane PM, undesired residue may not remain on the pellicle membrane PM and a clean state may be maintained.

Figure 20:
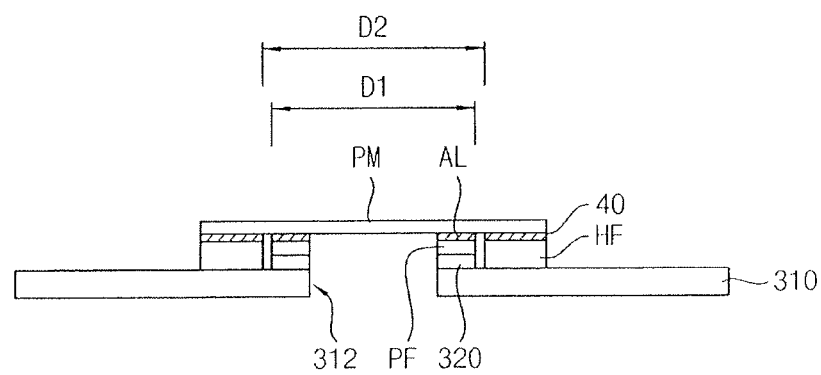

Referring to FIG. 20, the pellicle frame PF having an adhesive layer AL coated thereon may be loaded onto the pellicle frame 300, and then, the handling frame HF having the pellicle membrane PM disposed thereon may be loaded into a space over the pellicle frame 300 and then the pellicle membrane PM may be treated with vapor under vapor atmosphere. Then, the pellicle membrane PM may be attached onto the pellicle frame PF, and then, the pellicle membrane PM may be dried.

The adhesive layer AL may be coated on an upper surface of the pellicle frame PF. For example, the pellicle frame PF having the adhesive layer AL coated thereon may be supported on the protruding support 320 of the pellicle support 300. For example, the adhesive layer AL may include polyvinyl alcohol, polyvinyl acetate, etc.

The pellicle frame PF may have a first opening H1 in a middle region. For example, the first opening H1 may have a rectangular shape. The pellicle frame PF may have an outer diameter of a first size D1. The pellicle frame PF may have the outer diameter of the first size D1 smaller than the second size D2.

The handling frame HF having the pellicle membrane PM disposed thereon may be loaded into a space over the pellicle support 300 within the chamber 110 in FIG. 1. Then, the vapor generator 200 in FIG. 1 may heat the liquid L in the vaporizing portion 220 to generate vapor and may treat the pellicle membrane PM with the vapor, thereby removing wrinkles in the pellicle member PM. Additionally, the gel-phase adhesive layer AL coated on the pellicle frame PF may be treated with the vapor to be swollen, and then, may shrink again when drying to stretch the pellicle membrane PM more tight.

Then, the pellicle membrane PM may be attached onto the pellicle frame PF. The pellicle membrane PM may be stamped on the pellicle frame PF by the handling frame HF. The pellicle membrane PM may be attached onto the pellicle frame PF by the adhesive layer AL.

Then, the pellicle member PM may be dried and the handling frame HF may be removed to manufacture the pellicle having the pellicle membrane PM and the pellicle frame PF.

Hereinafter, a photomask assembly including the pellicle assembly manufactured by the above pellicle manufacturing method and a photo-exposure apparatus using the same will be explained.

Figure 21:
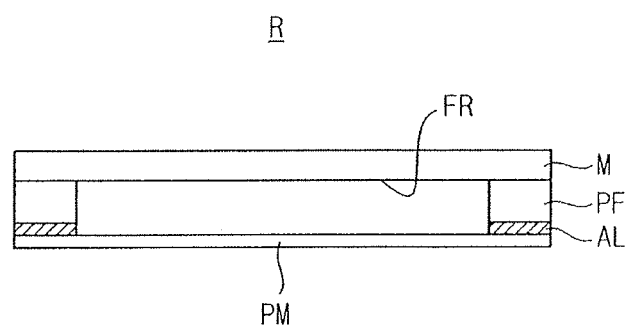

FIG. 21 is a cross-sectional view illustrating a photomask assembly in accordance with example embodiments.

Referring to FIG. 21, a photomask assembly R may include a photomask M and a pellicle assembly fixed on a surface FR of a front side of the photomask M. The pellicle assembly may include a pellicle membrane PM attached on a pellicle frame PF by an adhesive layer AL. The pellicle frame PF of the pellicle assembly may be fixed to the photomask M via an adhesive film. Accordingly, the pellicle membrane PM may be disposed over the surface of the front side of the photomask M to protect the photomask M.

In example embodiments, the photomask M may include a reflective photomask used to manufacture an integrated circuit such as a semiconductor device by transferring a pattern onto a wafer through a photo-exposure process. The photomask M may be used in an EUV photolithography process using a wavelength range of EUV light, for example, a photo-exposure wavelength of about 13.5 nm.

The surface FR of the front side of the photomask M may have a main pattern region for transferring a main pattern region onto a chip region of the wafer, an auxiliary pattern region for transferring an auxiliary pattern onto a scribe lane region of the wafer, and a black border region surrounding the main pattern region and the auxiliary pattern region.

The pellicle frame PF may be adhered on the black border region of the photomask M via the adhesive film. The adhesive film may include a silicon resin, a fluoride resin, an acrylic resin, etc.

Figure 22:
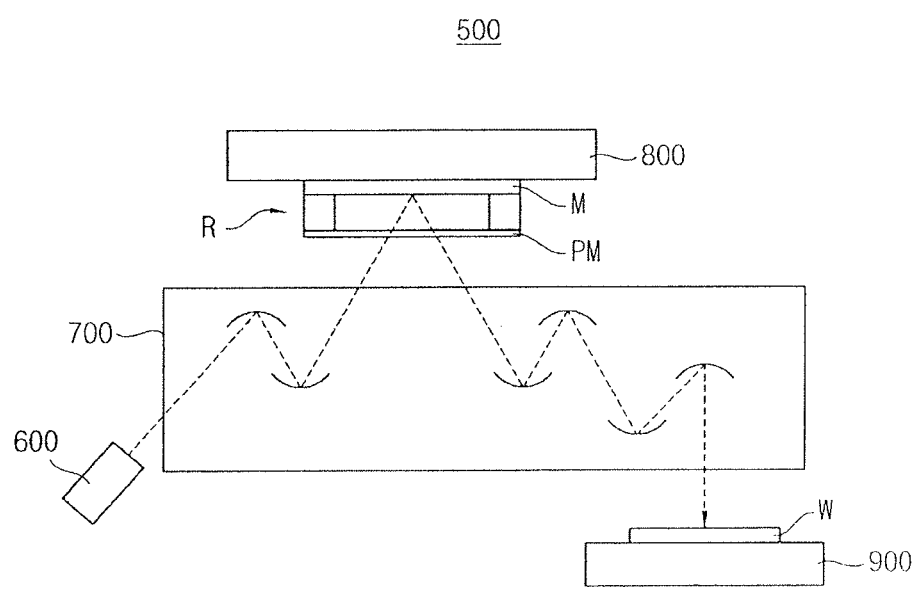

FIG. 22 is a cross-sectional view illustrating a photo-exposure apparatus in accordance with example embodiments.

Referring to FIG. 22, a photo-exposure apparatus 500 may include a light illumination portion 600, a mirror system 700, a reticle stage 800 and a wafer stage 900. The mirror system 700 may include an illumination mirror system and a projection mirror system.

In example embodiments, the photo-exposure apparatus 500 may perform a reflective photolithography process using the reticle (photomask assembly) R having the pellicle membrane PM attached thereon.

In particular, the light illumination portion 600 may include a light source, a light collector, etc. The light source may generate extreme ultra violet (EUV) light. For example, the light source may generate light having a wavelength of about 13.5 nm, for example, the EUV light, using carbon plasma. The EUV light generated from the light source may be irradiated to the illumination mirror system of the mirror system 700 through the light collector.

The illumination mirror system may include a plurality of illumination mirrors. The illumination mirrors may condense the EUV light in order to reduce loss of the EUV light which propagates out of the mirrored irradiating paths.

The reticle stage 800 may mount the reticle R on a lower surface thereof and may move in a horizontal direction. The reticle R may be mounted on the lower surface of the reticle stage 800 such that the surface (of the front side) on which optical patterns of the photomask M may be formed, may face downward.

The EUV light transferred from the illumination mirror system may be irradiated to the reticle R mounted on the reticle stage 800. The EUV light reflected from the reticle R mounted on the reticle stage 800 may be transferred to the projection mirror system.

The pellicle membrane PM disposed over the surface of the front side of the photomask M may have an excellent durability and an excellent transmittance with respect to the EVU light. The pellicle membrane PM may have no wrinkles and may have even surface, thereby minimizing CD variations due to membrane wrinkles.

The projection mirror system may receive the EUV light reflected from the reticle R and transfer the received EUV light to a wafer W. The projection mirror system may include a plurality of projection mirrors.

The wafer stage 900 may receive the wafer W and move in a horizontal direction. For example, a photoresist layer having a predetermined thickness may be formed on the wafer W, and the EUV light may be focused on the photoresist layer. Accordingly, the photo-exposure apparatus 500 may generate and irradiate the light onto the photoresist layer on the wafer W. Thus, the photoresist layer may be partially exposed based on the optical pattern information of the photomask M to form a photoresist pattern, and then a layer underlying the photoresist pattern may be partially etched to form a pattern on the wafer W.

By way of summation and review, when a thin pellicle membrane is attached onto a frame to manufacture the pellicle, the pellicle membrane may be torn or deformed, thereby generating wrinkles in the pellicle membrane. These wrinkles may cause critical dimension (CD) variations on a wafer during a photo-exposure process, resulting in image distortion.

In contrast, example embodiments provide a method of manufacturing a pellicle having excellent durability and transmittance. Example embodiments also provide an apparatus for assembling a pellicle having excellent durability and transmittance.

That is, according to example embodiments, a pellicle frame having an adhesive layer coated thereon may be loaded onto a pellicle support within a chamber, a pellicle membrane may be loaded into a space over the pellicle support, and then the chamber may be maintained in vapor atmosphere to treat the pellicle membrane with vapor. The pellicle membrane may be treated with the vapor to remove wrinkles which might have been formed in the pellicle membrane. Then, the pellicle membrane may be dried to continue manufacturing a pellicle assembly which includes the pellicle membrane attached on the pellicle frame.

The pellicle assembly may be disposed over a front side of a reflective photomask to protect the photomask from contaminants and may transmit a light irradiated to the photomask and a light reflected from the photomask. The relatively thin pellicle membrane may have an excellent durability and an excellent transmittance with respect to an EVU light. Further, the pellicle membrane may have no wrinkles and may have even surface, thereby minimizing CD variations due to membrane wrinkles.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. An apparatus for manufacturing a pellicle, the apparatus comprising:
    a chamber having a space for assembling the pellicle for covering a photomask;
    a vaporizer comprising a container to generate a vapor atmosphere in the chamber; and
    a pellicle support frame inside the chamber to support the pellicle to be assembled in the chamber, the pellicle frame including:
    a plate inside the chamber, the plate including a cavity, and
    a protrusion on a top surface of the plate, the protrusion surrounding the cavity of the plate.

2. The apparatus as claimed in claim 1, wherein the chamber having the space includes a lower chamber and an upper cover, the lower chamber having a bottom wall and a sidewall defining the space in the chamber, and the upper cover covering the lower chamber to form an airtight space.

3. The apparatus as claimed in claim 2, wherein the entirety of the pellicle frame is between the bottom wall and the upper cover of the chamber.

4. The apparatus as claimed in claim 2, wherein:
    the vaporizer is on the bottom wall of the chamber, the plate being between the vaporizer and the upper cover, and the cavity of the plate overlapping a top of the vaporizer, and
    vertical extensions extend along sides of the vaporizer to support the plate, the vertical extensions and the protrusion contacting opposite surfaces of the plate.

5. The apparatus as claimed in claim 4, wherein the vaporizer includes a bath on a heater, and the cavity of the plate is aligned with the bath.

6. The apparatus as claimed in claim 1, wherein the vaporizer is in a lower portion of the chamber to maintain the chamber at the vapor atmosphere.

7. The apparatus as claimed in claim 6, wherein the vaporizer includes a heater on a bottom wall of the lower chamber and a bath on the heater to receive a liquid.

8. The apparatus as claimed in claim 7, wherein the heater includes a hot plate to generate vapor.

9. The apparatus as claimed in claim 1, wherein the protrusion is frame-shaped in a top view, an opening through the frame-shaped protrusion overlapping the cavity of the plate.

10. The apparatus as claimed in claim 9, wherein the opening through the frame-shaped protrusion is aligned with the cavity of the plate.

11. The apparatus as claimed in claim 9, wherein an inner sidewall of the plate defines a perimeter of the cavity of the plate, the inner sidewall of the plate being coplanar with an inner sidewall of the protrusion defining a perimeter of the opening through the protrusion.

12. The apparatus as claimed in claim 1, further comprising a frame holder comprising holding arms on the top surface of the plate, the protrusion fitting into an opening through the frame holder.

13. The apparatus as claimed in claim 12, wherein bottom surfaces of the frame holder and the protrusion are in direct contact with the top surface of the plate.

14. The apparatus as claimed in claim 12, wherein the frame holder is moveable.

* * * * *